United States Patent
Kim et al.

(10) Patent No.: US 7,294,538 B2
(45) Date of Patent: Nov. 13, 2007

(54) METHOD OF POLYCRYSTALLIZATION, METHOD OF MANUFACTURING POLYSILICON THIN FILM TRANSISTOR, AND LASER IRRADIATION DEVICE THEREFOR

(75) Inventors: Hyun-Jae Kim, Seongnam (KR); Myung-Koo Kang, Seoul (KR)

(73) Assignee: Samsung Electronics Co., Ltd, Suwon-si, Gyeonggi-do (KR)

( * ) Notice: Subject to any disclaimer, the term of this patent is extended or adjusted under 35 U.S.C. 154(b) by 122 days.

(21) Appl. No.: 10/532,459

(22) PCT Filed: Oct. 21, 2003

(86) PCT No.: PCT/KR03/02212

§ 371 (c)(1),
(2), (4) Date: Nov. 2, 2005

(87) PCT Pub. No.: WO2004/038775

PCT Pub. Date: May 6, 2004

(65) Prior Publication Data

US 2006/0126672 A1    Jun. 15, 2006

(30) Foreign Application Priority Data

Oct. 22, 2002    (KR) ...................... 10-2002-0064511

(51) Int. Cl.
*H01L 21/84* (2006.01)
(52) U.S. Cl. ................. 438/166; 257/E21.561
(58) Field of Classification Search ........ 438/151–166; 257/E21.561
See application file for complete search history.

(56) References Cited

U.S. PATENT DOCUMENTS

| | | | |
|---|---|---|---|
| 4,933,248 A * | 6/1990 | Lind et al. | .................... 430/83 |
| 5,302,230 A | 4/1994 | Ino et al. | |
| 2001/0019863 A1 | 9/2001 | Yang | |
| 2002/0083557 A1 | 7/2002 | Jung | |
| 2002/0110962 A1 | 8/2002 | Wada et al. | |

FOREIGN PATENT DOCUMENTS

CN          1304548 A        7/2001

OTHER PUBLICATIONS

English Language Abstract, Publication No. CN 1304548, Jul. 18, 2001, 1 p.
Patent Abstracts of Japan, Publication No. 54-153745, Dec. 4, 1979, 1 page.
Patent Abstracts of Japan, Publication No. 56-047288, Apr. 28, 1981.
Patent Abstracts of Japan, Publication No. 60-247488, Dec. 7, 1985.
Patent Abstracts of Japan, Publication No. 01-214011, Aug. 28, 1989.
Patent Abstracts of Japan, Publication No. 02-165880, Jun. 26, 1990.
Patent Abstracts of Japan, Publication No. 03-235040, Oct. 21, 1991.

* cited by examiner

*Primary Examiner*—Richard A. Booth
(74) *Attorney, Agent, or Firm*—MacPherson Kwok Chen & Heid LLP

(57) ABSTRACT

A device for irradiating a laser beam onto an amorphous silicon thin film formed on a substrate. The device includes: a stage mounting the substrate; a laser oscillator for generating a laser beam; a projection lens for focusing and guiding the laser beam onto the thin film; a reflector for reflecting the laser beam guided onto the thin film; a controller for controlling a position of the reflector, and an absorber for absorbing the laser beam reflected by the reflector.

6 Claims, 5 Drawing Sheets transverse irradiation area

METHOD OF POLYCRYSTALLIZATION, METHOD OF MANUFACTURING POLYSILICON THIN FILM TRANSISTOR, AND LASER IRRADIATION DEVICE THEREFOR

BACKGROUND OF THE INVENTION (a) Field of the Invention

The present invention relates to a method of polycrystallization, a method of manufacturing a thin film transistor, and a laser irradiation device therefor.

(b) Description of the Related Art

In general, a liquid crystal display ("LCD") includes two panels with electrodes and a liquid crystal layer interposed therebetween. The two panels are combined with a sealant for sealing the liquid crystal layer, which is printed around the edges of the panels. The panels are supported by spacers distributed therebetween.

This LCD displays desired images by applying electric field using the electrodes to the liquid crystal layer with dielectric anisotropy and adjusting the strength of the electric field to control the amount of light passing through the panels. In this case, thin film transistors (TFTs) are used for controlling signals transmitted to the electrodes.

The most commonly used TFTs for an LCD adapts amorphous silicon as a semiconductor layer.

An amorphous silicon TFT has mobility of about 0.5 to 1 $cm^2/Vsec$, which is suitable for a switching element of an LCD. However, it is not sufficient for directly forming a driving circuit on an LCD panel.

In order to overcome such a problem, a TFT LCD including polysilicon with electron mobility of 20 to 150 $cm^2/Vsec$ has been developed. The relatively high electron mobility polysilicon TFT enables to implement a chip in glass technique that a display panel embeds its driving circuits.

Techniques for obtaining polycrystalline silicon thin film include as-deposition technique depositing polycrystalline silicon directly on a substrate at high temperature, a solid phase crystallization technique depositing amorphous silicon and crystallizing at high temperature of about 600° C., a technique depositing amorphous silicon and crystallizing by laser, and so forth. However, since those techniques require a high temperature process, it is not proper for application of glass substrates for LCDs. Also, they have a disadvantage that electrical characteristics are not uniform between TFTs due to non-uniform grain boundaries.

To solve these problems, a sequential lateral solidification process capable of adjusting the distribution of the grain boundaries has been developed. The process is based on the fact that the grains of polysilicon at the boundary between a liquid phase region exposed to laser beam and a solid phase region not exposed to laser beam grow in a direction perpendicular to the boundary surface. A mask having a slit pattern is provided, and a laser beam passes through transmittance areas of the mask to completely melt amorphous silicon, thereby producing liquid phase regions arranged in a slit pattern. Thereafter, the melted amorphous silicon cools down to be crystallized, and the crystal growth starts from the boundaries of the solid phase regions not exposed to the laser beam, and proceeds in the directions perpendicular to the boundary surface. The grains stop growing when they encounter each other at the center of the liquid phase region. The sequential lateral solidification process is performed with moving a die, which mounts a panel including the amorphous silicon film thereon, in a horizontal direction when irradiating the laser beam and such a scanning step is repeated along the horizontal direction to cover all areas of the panel.

The laser beam irradiation in the sequential lateral solidification process is made through a projection lens. At this time, the laser beam may be precisely focused on desired locations.

However, the focus of the laser beam varies depending on the temperature of the projection lens such that the crystallization of the polysilicon layer for the thin film transistor is non-uniform. In order to solve such a problem, it is most important to develop a technique of keeping the temperature of the projection lens constant when irradiating the laser beam.

SUMMARY OF THE INVENTION

It is a motivation of the present invention to provide a laser irradiation device capable of precisely controlling the focus of a laser beam during the sequential lateral solidification process, and a method of manufacturing a thin film transistor using the same.

According to an aspect of the present invention, a device for irradiating a laser beam onto an amorphous silicon thin film formed on a substrate is provided, which includes: a stage mounting the substrate; a laser oscillator for generating a laser beam; a projection lens for focusing and guiding the laser beam onto the thin film; a reflector for reflecting the laser beam guided onto the thin film; a controller for controlling a position of the reflector; and an absorber for absorbing the laser beam reflected by the reflector.

A method of manufacturing a thin film transistor using a laser irradiation device including a projection lens is also provided, which includes: depositing an amorphous silicon thin film on a substrate; irradiating a laser beam from the laser irradiation device onto the thin film through an exposure mask having a slit pattern to form a polysilicon layer after preheating the projection lens; patterning the polysilicon layer to form a semiconductor layer; depositing a first insulating layer on the semiconductor layer; forming a gate electrode on the first insulating layer; implanting impurities into the semiconductor layer to form source and drain regions; depositing a second insulating layer on the gate electrode; forming contact holes exposing the source and the drain regions in the first and the second insulating layers; and forming source and drain electrodes respectively connected to the source and the drain regions through the contact holes.

The polysilicon layer is preferably formed by lateral sequential solidification.

A pixel electrode, preferably made of a transparent conductive material or a reflective conductive material, connected to the drain electrode may be additionally formed.

A method of polycrystallization of an amorphous silicon thin film using a laser irradiation device including a projection lens is provided, which includes: depositing an amorphous silicon thin film on a substrate; preheating the projection lens without irradiating a laser beam from the laser irradiation device onto the thin film; and irradiating a laser beam from the laser irradiation device onto the thin film to form a polysilicon layer after the preheating.

The laser beam from the laser irradiation device is preferably reflected away from the thin film during the preheating.

BRIEF DESCRIPTION OF THE DRAWINGS

The present invention will become more apparent by describing preferred embodiments thereof in detail with reference to the accompanying drawings in which.

DETAILED DESCRIPTION OF THE PREFERRED EMBODIMENTS

Figure 1A:
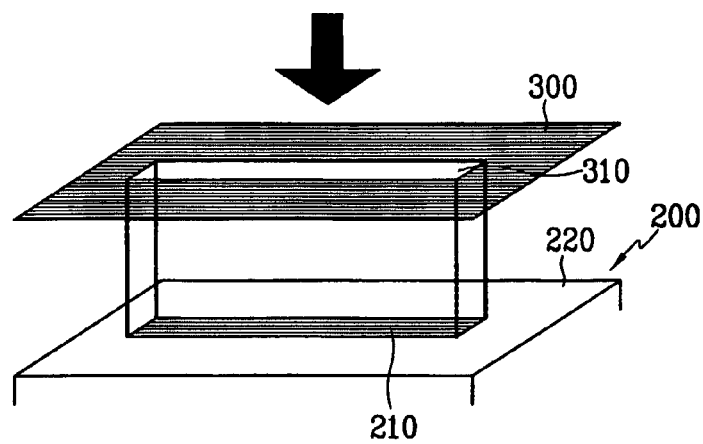
FIG. 1A is a schematic diagram showing a sequential lateral solidification process for crystallizing amorphous silicon into polysilicon by irradiating laser beam.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films, panels, regions, etc. are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

A laser irradiation device and a method of manufacturing a thin film transistor using a laser irradiation device according to an embodiment of the present invention will be now described in detail with reference to the accompanying drawings.

Figure 1B:
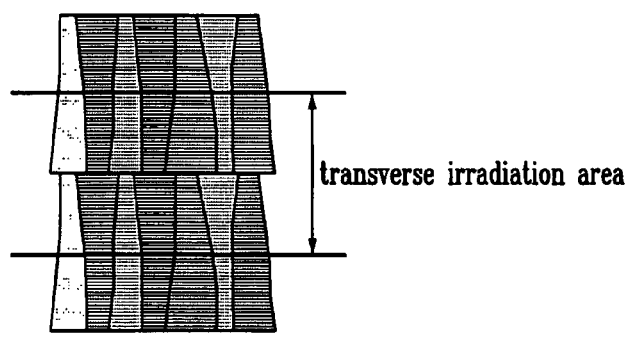
FIG. 1B schematically shows a detailed structure of a polycrystalline silicon thin film during crystallization from amorphous silicon to polycrystalline silicon in the sequential lateral solidification process.
Figure 1C:
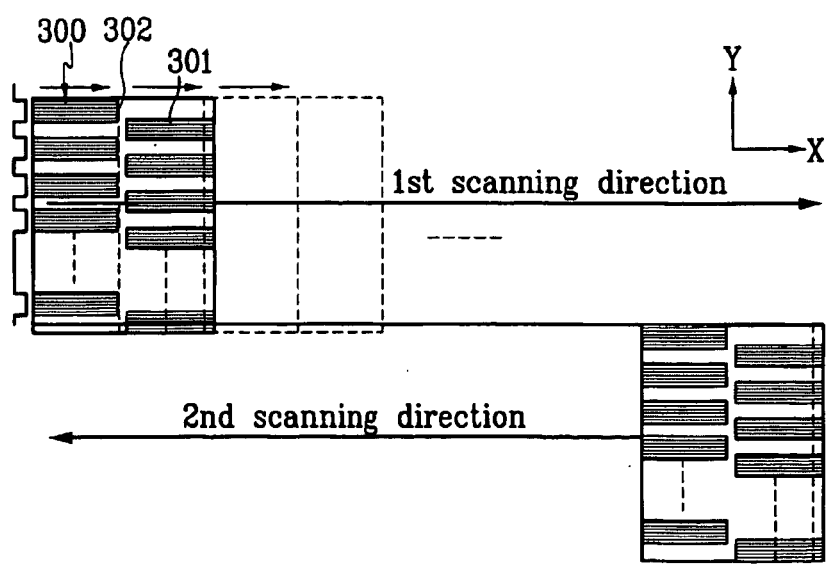
FIG. 1C schematically shows a scanning step in a sequential lateral solidification process for crystallizing amorphous silicon into polysilicon.

FIG. 1A is a schematic diagram showing a sequential lateral solidification process for crystallizing amorphous silicon into polysilicon by irradiating laser beam, FIG. 1B schematically shows a detailed structure of a polycrystalline silicon thin film during crystallization from amorphous silicon to polycrystalline silicon in the sequential lateral solidification process, and FIG. 1C schematically shows a scanning step in a sequential lateral solidification process for crystallizing amorphous silicon into polysilicon.

As shown in FIG. 1A, according to the sequential lateral solidification process, a laser beam is applied to a plurality of local regions of an amorphous silicon layer 200 formed on an insulating substrate using a mask 300 having a transmission area 310 with a slit pattern to completely melt the amorphous silicon in the local regions such that a plurality of liquid phase regions are formed in an area of the amorphous silicon layer 200 corresponding to the transmission area 310.

At this time, a grain of polycrystalline silicon grows from a boundary surface between the liquid phase region 210 exposed to the laser beam and a solid phase region 220 where the laser beam is not applied along a direction perpendicular to the boundary surface as shown in FIG. 1B. The grains stop growing when they meet at the center of the liquid phase region. They are grown to have a various size of a desired degree by performing the step along the growing direction of the grains to continue the lateral growth of the grains.

For instance, the sequential lateral solidification process illustrated in FIG. 1C uses a mask 300 including a plurality of transmissive areas 301 and 302 having slits. Each slit in the transmissive areas 301 and 302 is elongated in a transverse direction, and the transmissive areas 301 and 302 form a plurality of columns. The transmissive areas 301 and 302 in each column are arranged with a predetermined pitch, and the transmissive areas 301 and 302 in adjacent two columns are offset by about half of the pitch. The sequential lateral solidification moves the substrate by a width of the column in the transverse direction (i.e., x direction) with respect to the mask 300 after irradiating laser beams through the mask (referred to as a shot). Since the transmissive areas 301 and 302 are elongated in the x direction, the grain growth proceeds in the y direction by a width of the transmissive areas 301 and 302 as shown in FIG. 1B.

The movement of the substrate is performed by a stage mounting the substrate while a laser irradiation device is fixed.

Figure 2A:
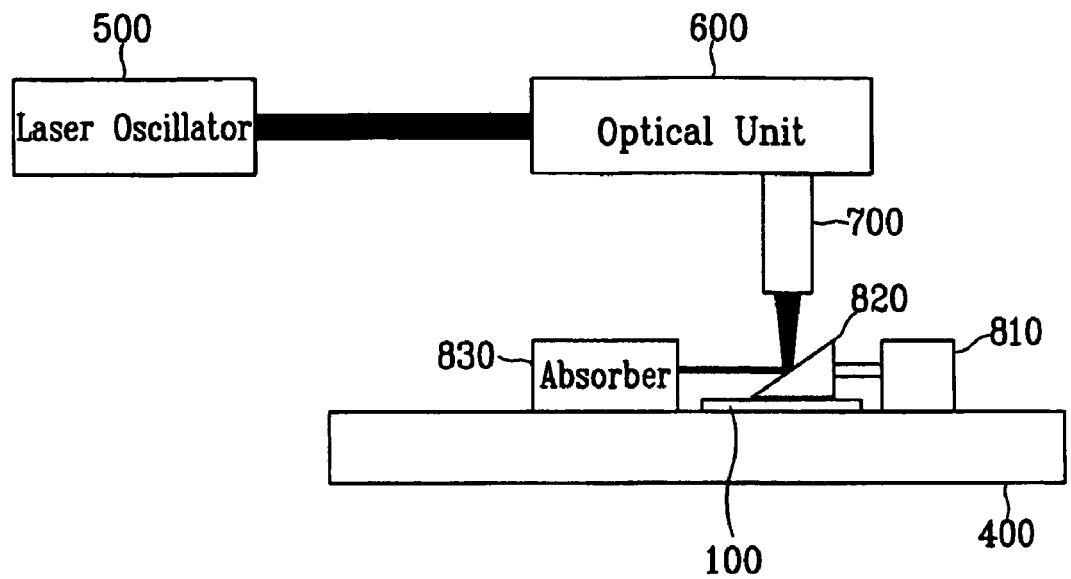
FIGS. 2A and 2B illustrate schematic diagrams of a laser irradiation device for polycrystallization according to an embodiment of the present invention.
Figure 2B:
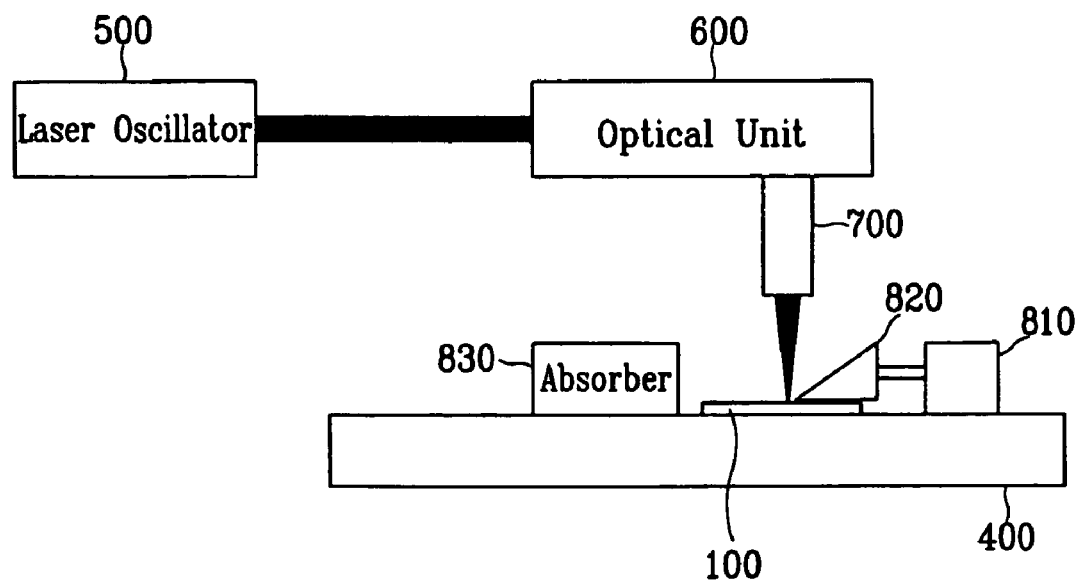

FIGS. 2A and 2B illustrate schematic diagrams of a laser irradiation device for polycrystallization according to an embodiment of the present invention.

A laser irradiation device according to an embodiment of the present invention generates a laser beam by frequency oscillation and irradiates the laser beam onto an amorphous silicon thin film formed on an insulating substrate 100 such as glass. Referring to FIGS. 2A and 2B, the laser irradiation device includes a stage 400 for fixing and supporting the substrate 100, a laser oscillator 500 for generating a uniform laser beam with a predetermined frequency, an optical unit 600, a projection lens 700, a reflector 820, an absorber 830, and a controller 810.

The optical unit 600 imparts a desired energy to the generated laser beam, removes the afterimage of the laser beam, and makes the frequency of the laser beam uniform. The projection lens 700 condenses the laser beam such that the laser beam is correctly focused onto the amorphous silicon thin film on the substrate 100.

The reflector 820 reflects the laser beam irradiated from the optical unit 600 through the projection lens 700 toward the absorber 830, which absorbs the reflected laser beam, under the control of the controller 810 so that the amorphous silicon layer of the substrate 100 is not exposed to the laser beam during the preheating of the protection lens 700 with a predetermined temperature as shown in FIG. 2A and it moves away from the substrate 100 under the control of the controller 810 such that the amorphous silicon layer is timely exposed to the laser beam when the temperature of the projection lens 700 is stabilized and the focusing of the projection lens 700 is completed as shown in FIG. 2B.

The laser irradiation device according to the embodiment of the present invention enables to perform uniform polycrystallization by irradiating the laser beam onto the amorphous silicon layer when the projection lens reaches a predetermined temperature to make the laser beam be exactly and uniformly focused on the amorphous silicon thin film.

A thin film transistor and a manufacturing method thereof using the laser irradiation device according to embodiments of the present invention will be now described in detail.

Figure 3:
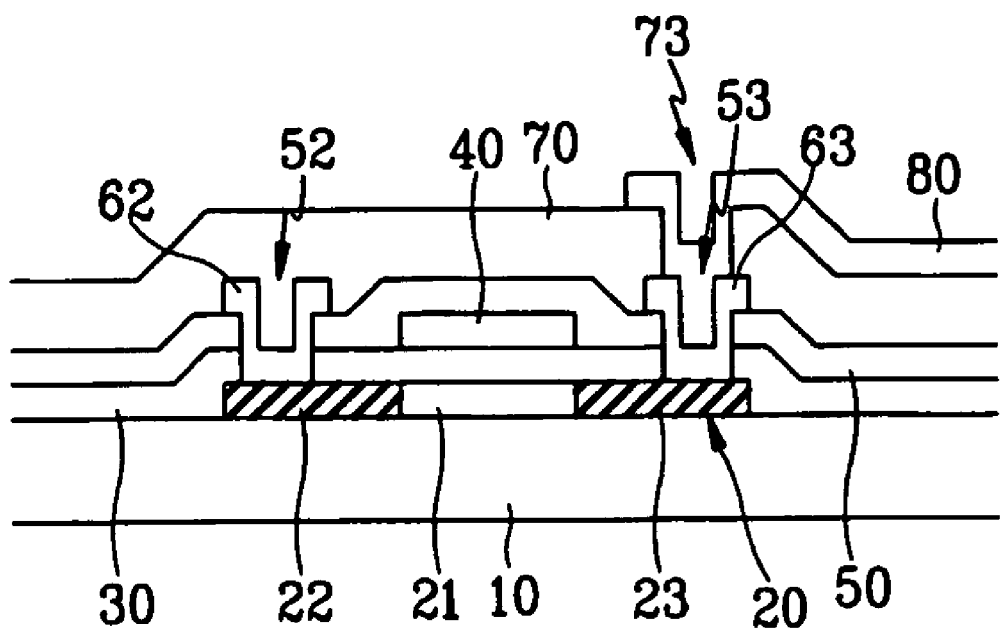
FIG. 3 is a sectional view of a polysilicon thin film transistor.

FIG. 3 is a sectional view of a polysilicon thin film transistor according to an embodiment of the present invention, and FIGS. 4A to 4E are sectional views of the polysilicon thin film transistor shown in FIG. 3 in intermediates steps of a manufacturing method thereof according to an embodiment of the present invention. Although the figures and the description thereof illustrates a thin film transistor for a pixel electrode, a thin film transistor for driving circuits on the substrate is also formed by the similar method.

As shown in FIG. 3, a semiconductor layer 20 made of polysilicon is formed on an insulating substrate 10. The semiconductor layer 20 includes a channel region 21 and source and drain regions 22 and 23 opposite each other with respect to the channel region 21. Here, the source and the drain regions 22 and 23 are doped with n type or p type impurity and may include a silicide layer.

A gate insulating layer preferably made of $SiO_2$ or $SiN_x$ and covering the semiconductor layer 20 is formed on the substrate 10, and a gate electrode 40 is formed on the gate insulating layer 30 opposite the channel region 21.

An interlayer insulating layer 50 covering the gate electrode 40 is formed on the gate insulating layer 30, and the gate insulating layer 30 and the interlayer insulating layer 50 have contact holes 52 and 53 exposing the source and the drain regions 22 and 23.

A source electrode 62 and a drain electrode 63 are formed on the interlayer insulating layer 50. The source electrode 62 is connected to the source region 22 via the contact hole 52, and a drain electrode 63 is opposite the source electrode 62 with respect to the gate electrode 40 and connected to the drain region 23 via the contact hole 53.

The interlayer insulating layer is covered with a protective layer 70 having a contact hole 73 exposing the drain electrode 63. A pixel electrode 80 is formed on the protective layer 70. The pixel electrode 80 is made of a transparent conductive material such as indium tin oxide (ITO) and indium zinc oxide (IZO), or a reflective conductive material, and it is connected to the drain electrode 63 through the contact hole 73.

Figure 4A:
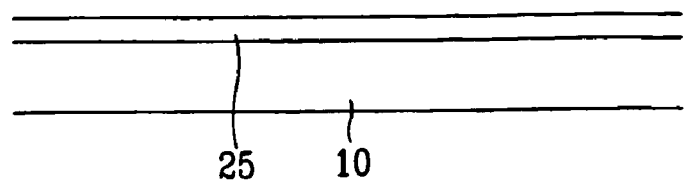
FIGS. 4A to 4E are sectional views of the polysilicon thin film transistor shown in FIG. 3 in intermediates steps of a manufacturing method thereof.

In a method of manufacturing a thin film transistor according to an embodiment of the present invention, as shown in FIG. 4A, an amorphous silicon thin film 25 is formed on an insulating substrate 10 by depositing amorphous silicon on the substrate 10 using low pressure chemical vapor deposition, plasma enhanced chemical vapor deposition or sputtering.

Thereafter, as shown in FIG. 1C, a polysilicon thin film 25 is formed by a sequential lateral solidification process using a mask with a slit pattern shown in FIG. 1C and a laser irradiation device shown in FIGS. 2A and 2B. In detail, a projection lens 700 of the irradiation device is preheated until the temperature of the projection lens 700 reaches a predetermined temperature. During the preheating of the projection lens 700, the controller 810 controls the reflector 820 such that the reflector 820 reflects the laser beam into the absorber 830 for preventing the laser beam from being irradiated onto the amorphous silicon thin film 25. The laser beam is focused and irradiated onto the amorphous silicon thin film 25 to start crystallizing the amorphous silicon by moving away the reflector 820 from the substrate 100 after the temperature of the projection lens 700 is kept uniform. The grains of the polysilicon layer 25 formed in this way can be uniform formed to make the performance characteristic of the thin film transistors be uniform.

Figure 4B:
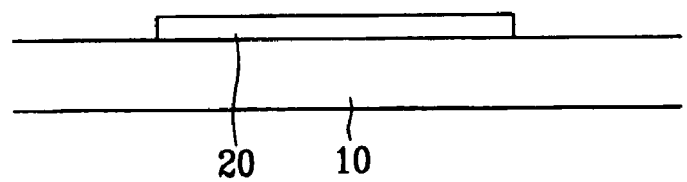

As shown in FIG. 4B, the polycrystalline silicon layer 25 is patterned by a photo-etching with a mask to form a polycrystalline silicon semiconductor layer 20.

Figure 4C:
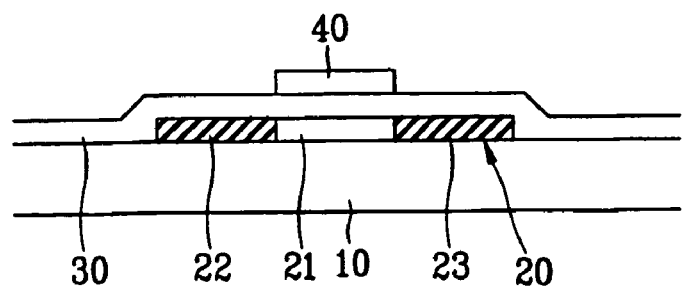

As shown in FIG. 4C, silicon oxide or silicon nitride is deposited to form a gate insulating layer 30. Subsequently, a conductive material for a gate wire is deposited and patterned to form a gate electrode 40. As shown in FIG. 4C, n or p-type impurities are then ion-implanted into the semiconductor layer 20 using the gate electrode 40 as a mask, and activated to form source and drain regions 22 and 23. The region between the source and the drain regions 22 and 23 is defined as a channel region 21.

Figure 4D:
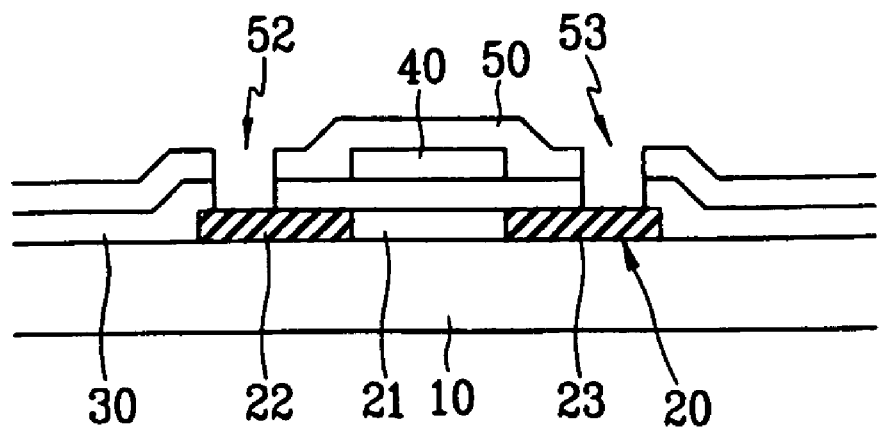

As shown in FIG. 4D, an interlayer insulating layer 50 covering the gate electrode 40 is formed on the gate insulating layer 30, and then, the interlayer insulating layer 50 as well as the gate insulating layer 30 and the planarization layer 90 is patterned to form contact holes 52 and 53 exposing the source and the drain regions 22 and 23 of the semiconductor layer 20.

Figure 4E:
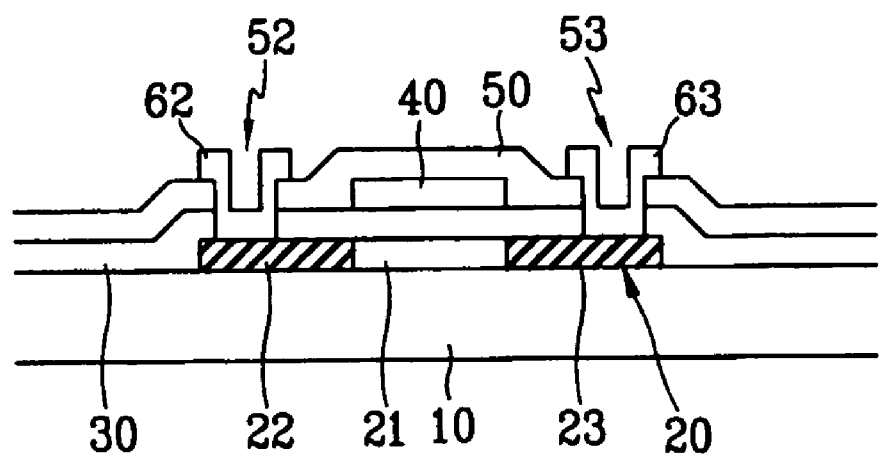

As shown in FIG. 4E, a metal for a data wire is deposited on the insulating substrate 10 and patterned to form a source electrode 62 and a drain electrode 63 connected to the source region 22 and the drain region 23 via the contact holes 52 and 53, respectively.

Thereafter, as shown in FIG. 3, a protective layer 70 is deposited thereon, and patterned to form a contact hole 73 exposing the drain electrode 63. A transparent conductive material such as ITO or IZO, or a reflective conductive material is deposited and patterned to form a pixel electrode 80.

As described above, the laser irradiation device according to the embodiment of the present invention enables to perform uniform polycrystallization by irradiating the laser beam onto the amorphous silicon layer when the projection lens reaches a predetermined temperature to make the laser beam be exactly and uniformly focused on the amorphous silicon thin film.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of manufacturing a thin film transistor using a laser irradiation device including a projection lens, the method comprising:

depositing an amorphous silicon thin film on a substrate;

irradiating a laser beam from the laser irradiation device onto the thin film through an exposure mask having a slit pattern to form a polysilicon layer after preheating the projection lens wherein the preheating is performed without irradiating a laser beam from the irradiation device onto the thin film;

patterning the polysilicon layer to form a semiconductor layer;

depositing a first insulating layer on the semiconductor layer, forming a gate electrode on the first insulating layer;

implanting impurities into the semiconductor layer to form source and drain regions;

depositing a second insulating layer on the gate electrode;

forming contact holes exposing the source and the drain regions in the first or the second insulating layers; and forming source and drain electrodes respectively connected to the source and the drain regions through the contact holes.

2. The method of claim 1 wherein the polysilicon layer is formed by lateral sequential solidification.

3. The method of claim 1 further comprising:
forming a pixel electrode connected to the drain electrode.

4. The method of claim 3 wherein the pixel electrode comprises a transparent conductive material or a reflective conductive material.

5. A method of polycrystallizing an amorphous silicon thin film using a laser irradiation device including a projection lens, the method comprising:

depositing an amorphous silicon thin film on a substrate;

preheating the projection lens without irradiating a laser beam from the laser irradiation device onto the thin film; and irradiating the laser beam from the laser irradiation device onto the thin film to be polycrystallized after the preheating.

6. The method of claim 5 wherein the laser beam from the laser irradiation device is reflected away from the thin film during the preheating.

* * * * *